United States Patent [19]

Matsuo et al.

[11] Patent Number: 4,893,029
[45] Date of Patent: Jan. 9, 1990

[54] POWER SUPPLY NOISE PROTECTION CIRCUIT

[75] Inventors: Ryosuke Matsuo, Yokohama; Masaru Koyanagi, Tokyo, both of Japan

[73] Assignee: Kabushiki Kaisha Toshiba, Kawasaki, Japan

[21] Appl. No.: 167,687

[22] Filed: Mar. 14, 1988

[30] Foreign Application Priority Data

Mar. 25, 1987 [JP] Japan .................................. 62-70766

[51] Int. Cl.$^4$ ...................... H03K 17/16; H03K 3/01; H03K 19/017
[52] U.S. Cl. ............................... 307/296.4; 307/443; 307/448; 307/530; 307/296.6; 365/226; 365/228
[58] Field of Search ............ 307/443, 448, 451, 296.4, 307/296.5, 296.6, 530; 365/226, 228

[56] References Cited

U.S. PATENT DOCUMENTS

| | | | |
|---|---|---|---|
| 4,475,048 | 10/1984 | Miyake et al. | 307/279 |
| 4,506,168 | 3/1985 | Uya | 307/290 |
| 4,707,626 | 11/1987 | Inoue | 307/451 |

OTHER PUBLICATIONS

I.B.M. Tech. Disc. Bul., vol. 21, No. 4, Sep. 1978, "Power Supply Stabilization Circuit".

Primary Examiner—Stanley D. Miller
Assistant Examiner—Margaret Rose Wambach
Attorney, Agent, or Firm—Finnegan, Henderson, Farabow, Garrett and Dunner

[57] ABSTRACT

A semiconductor integrated circuit has an input circuit, an internal circuit, and an output circuit. These circuits are all formed on a single chip and are connected to common power source lines. The input circuit includes an ordinary Schmitt trigger circuit, and an FET. The FET is turned on for a predetermined period of time by a control signal when the potentials of the power source lines (positive power source line and an earth line) are caused to fluctuate as a result of the internal circuit or the output circuit operating. Because of this, the level to detect the rising of the input signal is set to a level higher than the ordinary level for the period of time during which the potentials of the power source lines fluctuate.

10 Claims, 5 Drawing Sheets

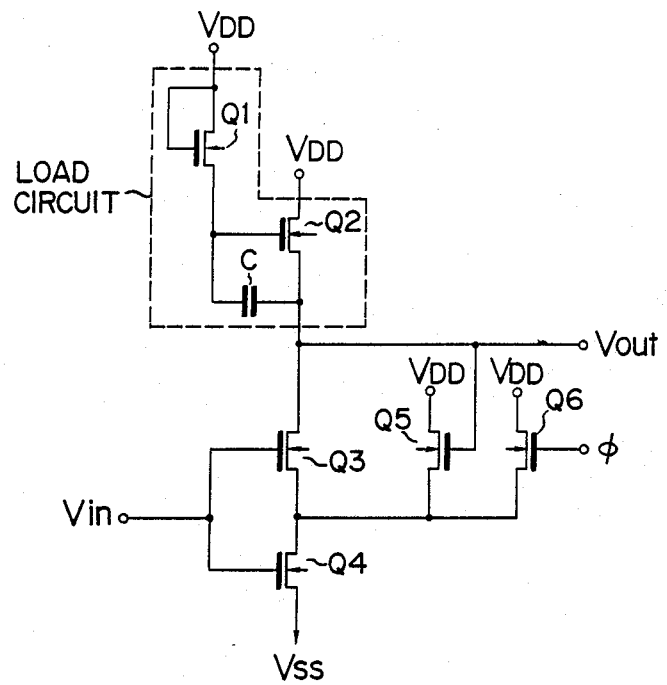
F I G. 1
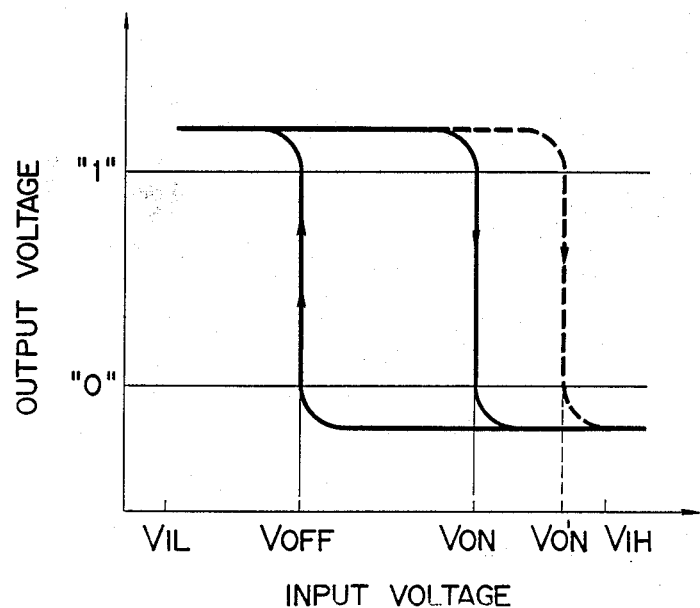
F I G 2

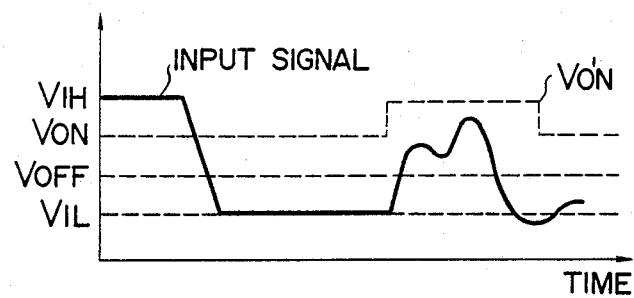
F I G. 3
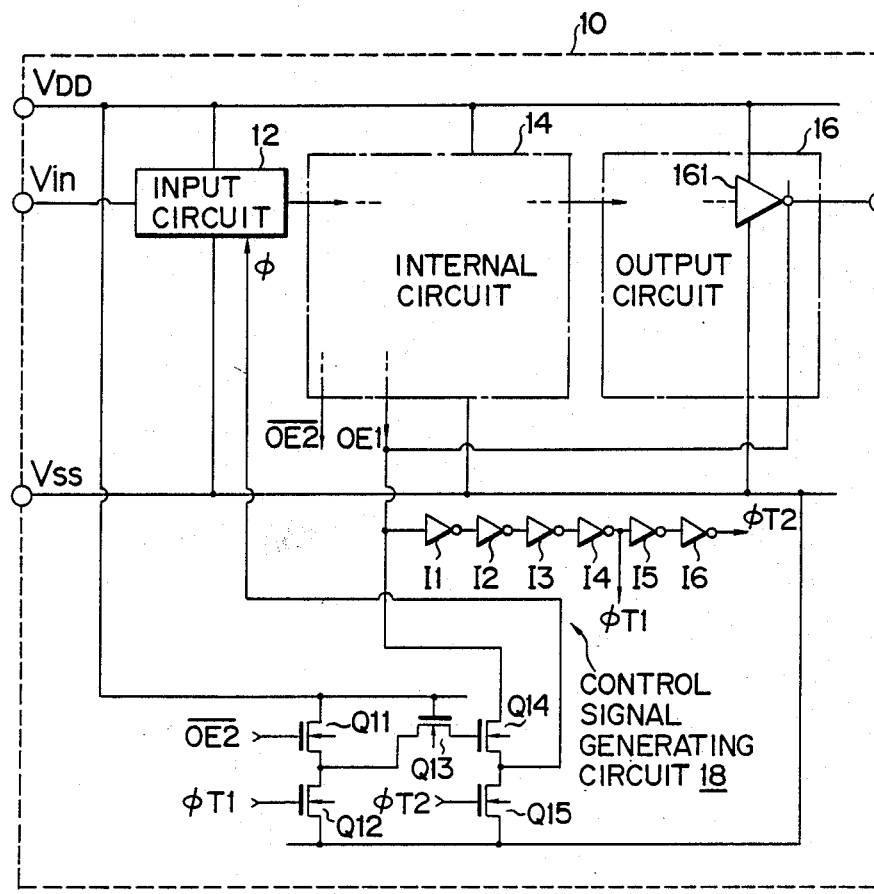
F I G. 4

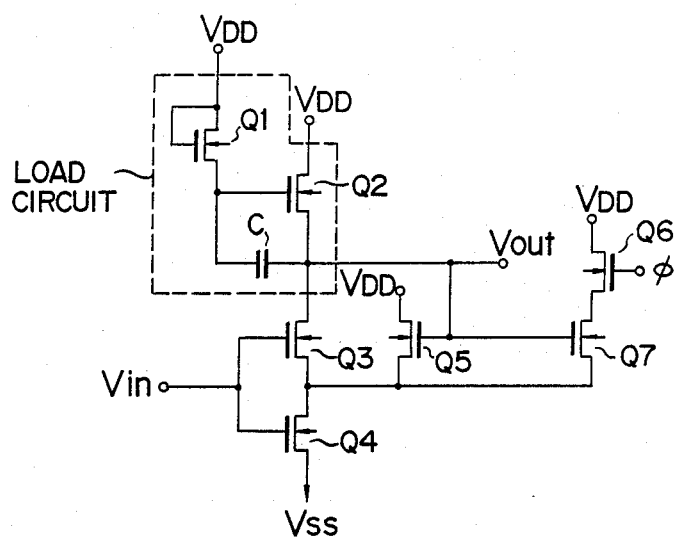
F I G. 9

POWER SUPPLY NOISE PROTECTION CIRCUIT

BACKGROUND OF THE INVENTION

The present invention relates to a semiconductor integrated circuit and, more particularly, to a semiconductor integrated circuit having a function which prevents malfunctioning of the circuit, arising from power source noises.

During the time a semiconductor integrated circuit is operating, a current flows through the power source lines of the circuit (i.e., a positive power source line and an earth line). When the current is large, the power source potential fluctuates. Such a fluctuation of the power source potential is called a power source noise since it causes a malfunction of the circuit.

In the case of a semiconductor integrated circuit, such as a semiconductor memory in which input/output data is constituted by a number of bits, the power source noise is generated when the "1" level is output from each output buffer, in order to read out the stored data, or when the "0" level is output from each of the output buffers. When the "1" level is output from each of the output buffers, this causes a delay in the timing at which the charges are supplied from the positive power source line to a load, with the result that the potential of the positive power source line quickly deteriorates. On the other hand, when the "0" level is output from each of the output buffers, the potential of the earth line increases rapidly. Since a capacitive component exists between the positive power source line and the earth line, when the potential of the positive power source line suddenly decreases due to an influence by the coupling, the potential of the earth line also decreases. Conversely, when there is a rapid increase in potential of the earth line, this brings about a corresponding increase in the potential of the positive power source line.

Since, in the case of a semiconductor integrated circuit, all the circuits (input circuit, internal circuit, output circuit) which are formed on a chip are connected to a common power source line, the power source noise which is generated through the driving of the output buffers change the level at which the input signal is detected in the input circuit. Thus, even if the input signal contains no noise, the input circuit operates as if the signal contains noise.

When power source noise, which will lower the potential of the positive power source line and that of the earth line, is generated while an input signal at the "0" level is being supplied to the input circuit, the potential of the input signal apparently rises, and the input circuit may detect this signal as one at the "1" level. Conversely, when such power source noise is generated while an input signal at the "1" level is being supplied to the input circuit, the potential of the input signal apparently falls, and the input circuit may detect this signal as one at the "0" level.

The input circuit is made of a Schmitt trigger circuit, in order not to make such an erroneous detection of the input signal. The schmitt trigger circuit has two threshold voltages Von and Voff different from each other. The first voltage, Von is used to detect that the input signal rises from the "0" level to the "1" level, and the second voltage, Voff, is used to detect that the input signal falls from the "1" level to the "0" level. As is well known, a Schmitt trigger circuit has a hysteresis input-output characteristic.

When the input circuit is a Schmitt trigger circuit, the following advantage can be obtained. That is, it does not malfunction when the power source noise is substantially smaller than its hysteresis voltage (=Von−Voff). The higher the hysteresis voltage, the greater noise the input circuit can withstand. If the hysteresis voltage of the input circuit exceeds a certain value, however, the operation margin to the input signal will decrease. Therefore, the hysteresis voltage cannot be above said value. It follows that the input circuit will malfunction when the power source noise is too large.

SUMMARY OF THE INVENTION

Accordingly it is the object of the present invention to provide a semiconductor integrated circuit which can properly operate even if the power source noise is generated, and which has a large operation margin to input signals.

According to the present invention, there is provided a semiconductor integrated circuit having an input circuit, an internal circuit, and an output circuit, all of which are formed on a single chip and are connected to common power source lines, this input circuit comprising: a load circuit which is located between a positive power source line and a signal output terminal; first and second FETs, both of the same conductivity type, which are serially connected between the signal output terminal and an earth line, and in which an input signal is respectively supplied to the gates of the first and second FETs; a third FET, one end of which is connected to the positive power source line and the other end of which is connected to the series connecting point of the first and second FETs, and a gate of which is connected to the signal output terminal; and a fourth FET one end of which is supplied with a predetermined potential and the other end of which is connected to the series connecting point of the first and second FETs, and which is turned on for a predetermined period of time by a control signal emitted when the potentials of the positive power source line and the earth line are caused to fluctuate as a result of the internal circuit or output circuit operating.

BRIEF DESCRIPTION OF THE DRAWINGS

FIG. 1 is a circuit diagram showing the first embodiment of an input circuit which is incorporated in a semiconductor integrated circuit according to the present invention;

FIG. 2 is a diagram showing the input and output characteristics of the input circuit shown in FIG. 1;

FIG. 3 is a diagram showing the relationship between the noise which is input to the input circuit shown in FIG. 1 and a threshold voltage;

FIG. 4 is a diagram showing an example of a practical constitution of a circuit for generating a control signal, incorporated in the input circuit shown in FIG. 1;

FIG. 9 is a circuit diagram showing the third embodiment of an input circuit which is incorporated in a semiconductor integrated circuit according to the invention.

DETAILED DESCRIPTION OF THE PREFERRED EMBODIMENT

Figure 5:
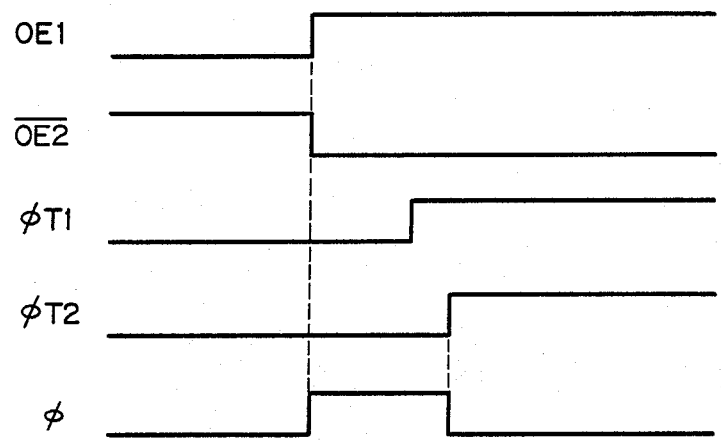
FIG. 5 is a timing chart for explaining the operation of the generating circuit shown in FIG. 4.

FIG. 1 shows the first embodiment of an input circuit which is incorporated in a semiconductor integrated circuit according to the present invention. This input circuit is formed together with an internal circuit and an output circuit on a single chip, and all three circuits are connected to common power source lines (line of positive power source $V_{DD}$, line of earth potential $V_{SS}$).

As is shows in FIG. 1, the input circuit comprises capacitor C and N type MOS FETs Q1 to Q6. Capacitor C and MOS FETs Q1 and Q2 are connected, such that they form a bootstrap type load circuit. This load circuit is connected between a positive power source $V_{DD}$ line and a signal output terminal $V_{out}$. The source-drain paths of MOS FETs Q3 and Q4 are connected in series, between the signal output terminal and an earth potential $V_{ss}$ line. An input signal Vin is externally supplied to the gates of FETs Q3 and Q4. MOS FET Q5 is connected at one end to the $V_{DD}$ line and at the other end to the node of FETs Q3 and Q4. The gate of FET Q5 is coupled to signal output terminal Vout. MOS FET Q6 is connected at one end to the $V_{DD}$ line and at the other end to the node of FETs Q3 and Q4. A control signal $\phi$ is supplied to the gate of this FET Q6. The control signal $\phi$ remains at the "1" level for a prescribed period every time power source noise is generated.

In the input circuit constituted in this manner, since FET Q5 is controlled in accordance with the potential of the signal output terminal, the potential at the connecting point of FETs Q3 and Q4 change in accordance with the operating state of FET Q5. Thus, the input circuit has such a hysteresis characteristic as is shown by the solid line in FIG. 2. On the other hand, since control signal $\phi$ remains at the "1" level for the predetermined period when power source noise is generated, FET Q6 is turned on for this period, and the potential of the connecting point of FETs Q3 and Q4 is raised. In other words, when the control signal $\phi$ at the "1" level is supplied to MOS FET Q6 while the input signal Vin and the output signal Vout remain at the "0" level and the "1" level, respectively, the threshold voltage Von generated at the rising edge of the signal Vin rises to Von, as is shown by the broken line in FIG. 2.

Therefore, when the "0" level of input signal $V_{in}$ is detected, even in the case where the power source noise such as to reduce earth potential Vss is generated and a noise as shown in FIG. 3 is mixed to input signal $V_{in}$ of the "0" level, the input signal can be accurately detected. A malfunction of the internal circuit can be prevented.

On the other hand, control signal $\phi$ is again returned to the "0" level after an elapse of the predetermined period of time. Therefore, if the power source noise is extinguished and the level of input signal $V_{in}$ changes from "0" to "1", voltage $V_{on}$ is set to the threshold voltage.

Therefore, in the case of using the circuit in FIG. 1 as an input circuit of a semiconductor memory, this circuit is effective as an input circuit of row address strobe signal RAS or column address strobe signal CAS in each of which the "0" level should be ordinarily compensated during the driving of the output buffers.

As mentioned above, the power source noise is generated when a large amount of current flows out from positive power source VDD line and when a large amount of current flows into earth potential Vss line. Therefore, as control signal $\phi$, for example, it is possible to use a signal which rises to the "1" level in accordance with the timing when signal $OE_1$ to activate the output buffers rises and which is returned to the "0" level after the "1" level was held for a predetermined period of time.

FIG. 4 shows a constitution of a control signal generating circuit to generate control signal $\phi$ of the "1" level for a predetermined period of time in accordance with signal $OE_1$ to activate the output buffers. In FIG. 4, reference numeral 12 denotes an input circuit constituted as shown in FIG. 1. Input circuit 12 is formed on chip 10 together with internal circuit 14 and output circuit 16. Further, control signal generating circuit 18 is also formed on chip 10.

Control signal generating circuit 18 comprises: six inverters I1 to I6 which are cascade connected. and five N type MOS FETs Q11 to Q15. Current paths between respective sources and drains of FETs Q11 to Q12 are serially connected between positive power source VDD line and earth potential Vss line. Signal $OE_2$ is supplied to a gate of FET Q11. Signal $\phi_{T1}$ is supplied to a gate of FET Q12. The series connecting point of FETs Q11 and Q12 is connected to a gate of FET Q14 through a current path between a source and a drain of FET Q13. A gate of FET Q13 is connected to positive power source VDD line. Signal $OE_1$ from internal circuit 14 is supplied to a drain of FET $Q_{14}$ and its source is connected to a drain of FET $Q_{15}$. A source of FET $Q_{15}$ is connected to earth potential Vss line and signal $\phi_{T2}$ is supplied to its gate. The potential of the connecting point of FETs Q14 and Q15 is sent as control signal $\phi$ to input circuit 12.

Signal $OE_1$ is supplied to an input terminal of first stage inverter I1 among the cascade connected inverters. Signal $\phi_{T1}$ is taken out of an output of fourth inverter I4. Signal $\phi_{T2}$ is taken out of an output of last inverter I6.

When output buffer 161 is activated, signal OE1 which is output from internal circuit 14 rises from the "0" level to the "1" level and signal $\overline{OE_2}$ falls from the "1" level to the "0" level. As shown in FIG. 5, signal $\phi_{T1}$ rises later by only the time corresponding to the delay time which is caused by invnenrter I1 to I4 to signal $OE_1$. On the other hand, signal $\phi_{T2}$ also rises further later by only the time corresponding to the delay time which is caused by inverters I5 and I6 than the leading timing of signal $\phi_{T1}$.

Therefore, in control signal generating circuit 16, control signal $\phi$ which is output from the connecting point of FETs Q14 and Q15 is held to the "1" level for the period of time until signal $\phi_{T2}$ rises after signal $OE_1$ rose.

Figure 6:
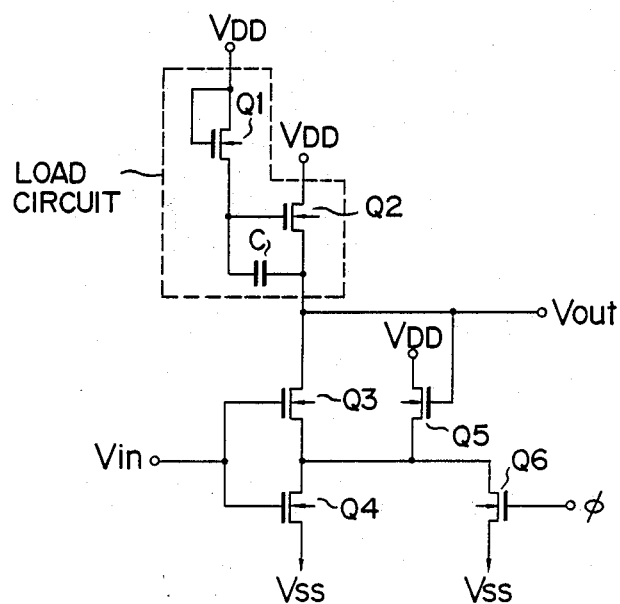
FIG. 6 is a circuit diagram showing the second embodiment of an input circuit which is incorporated in a semiconductor integrated circuit according to the invention.

FIG. 6 shows an input circuit in the second embodiment of the invention. In this input circuit, in a manner similar to the input circuit of FIG. 1, the hysteresis characteristic is changed by applying control signal $\phi$ to a gate of N type MOS FET Q6 whose one end is connected to the connecting point of N type MOS FETs Q3 and Q4. However, in this input circuit, the other end of FET Q6 is connected to earth potential Vss line instead of positive power source VDD line.

Figure 7:
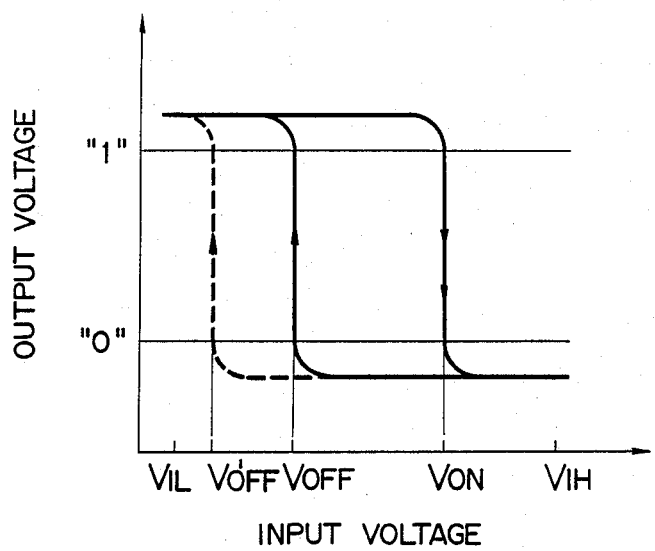
FIG. 7 is a diagram showing the input and output characteristics of the input circuit shown in FIG. 6.

In the input circuit with the above constitution, when control signal $\phi$ is set to the "1" level, FET Q6 is turned on, so that the potential of the connecting point of FETs Q3 and Q4 is reduced. Therefore, when input signal $V_{in}$ is at the "1" level and the potential, i.e., output signal $V_{out}$ of the signal output terminal is at the "0" level, if control signal $\phi$ of the "1" level is supplied, threshold voltage $V_{off}$ when input signal $V_{in}$ falls is reduced to $V_{off}'$, so that the input and output characteristics are as shown in FIG. 7.

Figure 8:
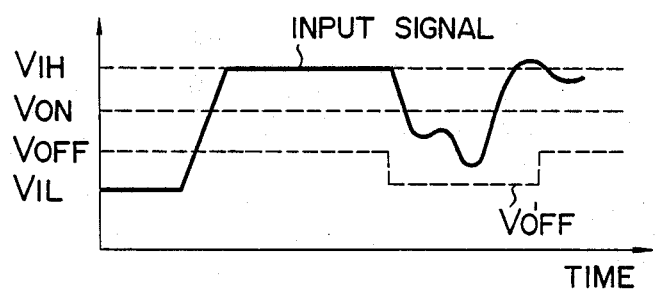
FIG. 8 is a diagram showing the relationship between the noise which is input to the input circuit shown in FIG. 6 and a threshold voltage.

Therefore, when the "1" level of input signal $V_{in}$ is detected, even if the power source noise such as to increase earth potential $V_{ss}$ is generated and a noise as shown in FIG. 8 is mixed to input signal $V_{in}$ of the "1" level, $V_{off}$ is reduced to $V_{off}'$, so that the malfunction of the circuit can be prevented.

Accordingly, this input circuit is effective as a circuit to detect write enable signal WE which is ordinarily at the "1" level during the driving of the output buffers.

FIG. 9 shows an input circuit in the third embodiment of the present invention. In this input circuit, in addition to the constitution of the circuit of FIG. 1, N type MOS FET Q7 is inserted between the connecting point of FETs Q3 and Q4 and one end of FET Q6. Switching operation of FET Q7 is controlled by the potential of the signal output terminal.

With this constitution, when the input signal $V_{in}$ starts rising from the "0" level to the "1" level and the potential of the signal output terminal starts falling, the turn-off of transistor Q7 is started, so that the supply of charges of FET Q6 is shut out. Therefore, in this circuit, even if control signal $\phi$ is set to the "1" level during the level transition of the input signal from "0" to "1", threshold voltage $V_{on}$ does not increase. Thus, a fluctuation in output signal $V_{out}$ can be prevented and the stable operation can be assured.

The power source noise is generated not only when the output buffers are driven but also, for example, when the bit line is precharged in the case of the memory circuit. Therefore, even if control signal $\phi$ is set to the "1" level for a predetermined period of time in accordance with a precharge signal, the withstanding noise amount can be improved.

What is claimed is:

1. A semiconductor integrated circuit having an input circuit, an internal circuit, and an output circuit formed together on a single chip, each of said circuits being connected to common power source lines, said input circuit comprising:
    a load circuit coupled between a power source potential supply terminal and a signal output terminal;
    first and second FETs, of the same conductivity type, serially connected between said signal output terminal and a common potential supply terminal and having a series connecting point therebetween, each of said first and second FETs having a gate connected to receive an input signal;
    a third FET connected between said power source potential supply terminal and the series connecting point of said first and second FETs, said third FET having a gate connected to said signal output terminal;
    a fourth FET, connected between a predetermined potential and the series connecting point of said first and second FETs, and
    control means, responsive to operation of either of said internal circuit or said output circuit, for turning on said fourth FET for a predetermined period of time when the operation of said terminal circuit or said output circuit is likely to cause the potentials of the common power source lines to fluctuate.

2. A semiconductor integrated circuit according to claim 1, wherein said output circuit has output buffer amplifiers and said control means turns on said fourth FET for a predetermined period of time the output buffers of said output circuit are driven.

3. A semiconductor integrated circuit according to claim 1, wherein said fourth FET is connected to said power source potential supply terminal.

4. A semiconductor integrated circuit according to claim 1, wherein said fourth FET is connected to said common potential supply terminal.

5. A semiconductor integrated circuit according to claim 3, wherein said semiconductor integrated circuit is a semiconductor memory and the input signal which is input to said input circuit is a row address strobe signal.

6. A semiconductor integrated circuit according to claim 3, wherein said semiconductor integrated circuit is a semiconductor memory and the input signal which is input to said input circuit is a column address strobe signal.

7. A semiconductor integrated circuit according to claim 3, wherein said semiconductor integrated circuit is a semiconductor memory and the input signal which is input to said input circuit is an output enable signal.

8. A semiconductor integrated circuit according to claim 4, wherein said semiconductor integrated circuit is a semiconductor memory and the input signal which is input to said input circuit is a write enable signal.

9. A semiconductor integrated circuit having an input circuit, an internal circuit, and an output circuit formed together on a single chip, each of said circuits being connected to common power source lines, said input circuit comprising:
    a load circuit coupled between a power source potential supply terminal and a signal output terminal;
    first and second FETSs, of the same conductivity type, serially connected between said signal output terminal and a common potential supply terminal and having a series connecting point therebetween, each of said first and second FETs having a gate connected to receive an input signal;
    a third FET connected between said power source potential supply terminal and the series connecting point of said first and second FETs, said third FET having a gate connected to said signal output terminal;
    a fourth and fifth FET connected between a predetermined potential and the series connecting point of said first and second FETs, said fifth FET having a gate connected to said signal output terminal; and
    control means, responsive to operation of either of said internal circuit or said output circuit, for turning on said fourth FET for a predetermined period of time when the operation of said internal circuit or said output circuit is likely to cause the potentials of the common power source lines to fluctuate.

10. A semiconductor integrated circuit comprising:
    first and second FETs, of the same conductivity type, serially connected between a signal output terminal and a first common potential supply terminal and having a series connecting point therebetween, each of said first and second FETs having a gate connected to receive an input signal;

means for coupling a second power source potential supply terminal to said signal output terminal;

a third FET connected between one of said power source potential supply terminal and the series connecting point of said first and second FETs, said third FET having a gate connected to said signal output terminal, thereby forming with said first and second FETs a Schmitt trigger circuit having a hysteresis characteristic; and means for altering the hysteresis characteristic of said Schmitt trigger circuit comprising means for generating a control signal and a fourth FET connected between a predetermined potential and the series connecting point of said first and second FETs, said fourth FET turning on for a predetermined period of time in response to said control signal to alter said hysteresis characteristic.

* * * * *